(12) United States Patent
Torii

(10) Patent No.: US 9,704,592 B2
(45) Date of Patent: Jul. 11, 2017

(54) SEMICONDUCTOR STORAGE DEVICE AND DATA READ METHOD

(71) Applicant: MIE FUJITSU SEMICONDUCTOR LIMITED, Kuwana-shi, Mie (JP)

(72) Inventor: Satoshi Torii, Kuwana (JP)

(73) Assignee: MIE FUJITSU SEMICONDUCTOR LIMITED, Kuwana (JP)

( * ) Notice: Subject to any disclaimer, the term of this patent is extended or adjusted under 35 U.S.C. 154(b) by 0 days.

(21) Appl. No.: 15/221,008

(22) Filed: Jul. 27, 2016

(65) Prior Publication Data

US 2017/0040064 A1   Feb. 9, 2017

(30) Foreign Application Priority Data

Aug. 6, 2015 (JP) ................. 2015-155813

(51) Int. Cl.
G11C 16/04 (2006.01)
G11C 16/28 (2006.01)
G11C 16/24 (2006.01)

(52) U.S. Cl.
CPC .......... G11C 16/28 (2013.01); G11C 16/0408 (2013.01); G11C 16/24 (2013.01)

(58) Field of Classification Search
CPC ......... H01L 127/115; H01L 127/11521; H01L 127/11524; G11C 16/0491; G11C 16/0483
USPC ........................................ 365/185.05, 185.17
See application file for complete search history.

(56) References Cited

U.S. PATENT DOCUMENTS

| 8,982,632 B2* | 3/2015 | Ogawa ............... G11C 16/0483 365/185.02 |
| 2008/0304321 A1 | 12/2008 | Kye et al. |
| 2012/0243335 A1 | 9/2012 | Torii |

FOREIGN PATENT DOCUMENTS

| JP | 2004-253135 A | 9/2004 |
| JP | 2007-172743 A | 7/2007 |
| JP | 2008-077750 A | 4/2008 |
| JP | 2009-508283 A | 2/2009 |
| JP | 2012-198961 A | 10/2012 |

* cited by examiner

Primary Examiner — Huan Hoang
(74) Attorney, Agent, or Firm — Westerman, Hattori, Daniels & Adrian, LLP

(57) ABSTRACT

A semiconductor storage device including plural bit lines, plural select gate lines that intersect with the plural bit lines, and plural memory cells that each include a p-channel memory transistor. The semiconductor storage device includes plural p-channel charging transistors that are respectively connected to the plural bit lines, and a charging line that is connected to each of the plurality of charging transistors. A controller that ON/OFF controls the charging transistors places each of the charging transistors in an ON state prior to read current flowing in a read target bit line, and that places the charging transistor connected to the read target bit line in an OFF state when read current flows in the read target bit line.

19 Claims, 5 Drawing Sheets

SEMICONDUCTOR STORAGE DEVICE AND DATA READ METHOD

CROSS-REFERENCE TO RELATED APPLICATION

This application is based upon and claims the benefit of priority of the prior Japanese Patent Application No. 2015-155813, filed on Aug. 6, 2015, the entire contents of which are incorporated herein by reference.

FIELD

The embodiments discussed herein are related to a semiconductor storage device and data read method.

BACKGROUND

The following technology is known in relation to semiconductor storage devices. Namely, semiconductor storage devices are known that have a local bit line (LBL) laid out for each sector corresponding to each global bit line (GBL). In such semiconductor storage devices, a sector select transistor connects an LBL to a GBL, and ON/OFF controls the sector select transistor of the sector corresponding to the sector select line. Plural word lines (WL) are provided so as to intersect with each LBL, and memory cells are laid out so as to correspond to the intersection locations between each LBL and WL. The memory cells include memory transistors that connect source lines to corresponding LBLs, and that are ON/OFF controlled by the corresponding WL. Charging transistors connect LBLs to a charging line. Charging gate lines ON/OFF control the charging transistors. A pre-charge potential is applied to an LBL by a charging transistor adopting an ON state.

Moreover, semiconductor storage devices are known that are equipped with flash memory arrays configured from plural non-volatile memory cells laid out in a matrix pattern. In such semiconductor storage devices, a current source for reading supplies a current in parallel to each of the main bit lines during read operation. A column switch circuit connects a main bit line from out of plural main bit lines that is specified by an address signal to a common bit line. During read operation, a sense amplifier is input with a read signal transmitted by a common bit line, compares the potential of the main bit lines connected to the common bit line against a reference potential, and detects whether or not a current has flowed between the drain and the source of the non-volatile memory cell to be read.

Semiconductor storage devices are also known that are equipped with a pre-charge stage including a read charge transistor capable of applying a specific read potential to a bit line in order to read data, and a read discharge transistor that connects bit line not selected during reading to a ground potential. In these semiconductor storage devices, the non-selected bit lines are held at the ground potential, and, after being preparatory charged, the selected bit lines adopt a floating state and are connected to the sense amplifier.

RELATED PATENT DOCUMENTS

JP-A No. 2012-198961
JP-A No. 2007-172743
JP-A No. 2004-253135

SUMMARY

According to an aspect of the embodiments, a semiconductor storage device includes: a plurality of bit lines; a plurality of select gate lines that intersect with the plurality of bit lines; a plurality of memory cells that each include a p-channel memory transistor, with the plurality of memory cells each disposed so as to correspond to respective portions of intersection between the plurality of bit lines and the plurality of select gate lines; a source line that is connected to each of the memory transistors, and that is applied with a first specific potential when reading data stored in the memory cells; a plurality of p-channel charging transistors that are respectively connected to the plurality of bit lines; a charging line that is connected to each of the plurality of charging transistors, and that is applied with a second specific potential when reading data stored in the memory cells; and a controller that places each of the charging transistors in an ON state prior to current, corresponding to data stored in a read target memory cell of the plurality of memory cells on which data reading is to be performed, flowing in a read target bit line that is one of the plurality of bit lines and that corresponds to the read target memory cell, the controller placing a charging transistor connected to the read target bit line in an OFF state when a current corresponding to data stored in the read target memory cell flows in the read target bit line.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
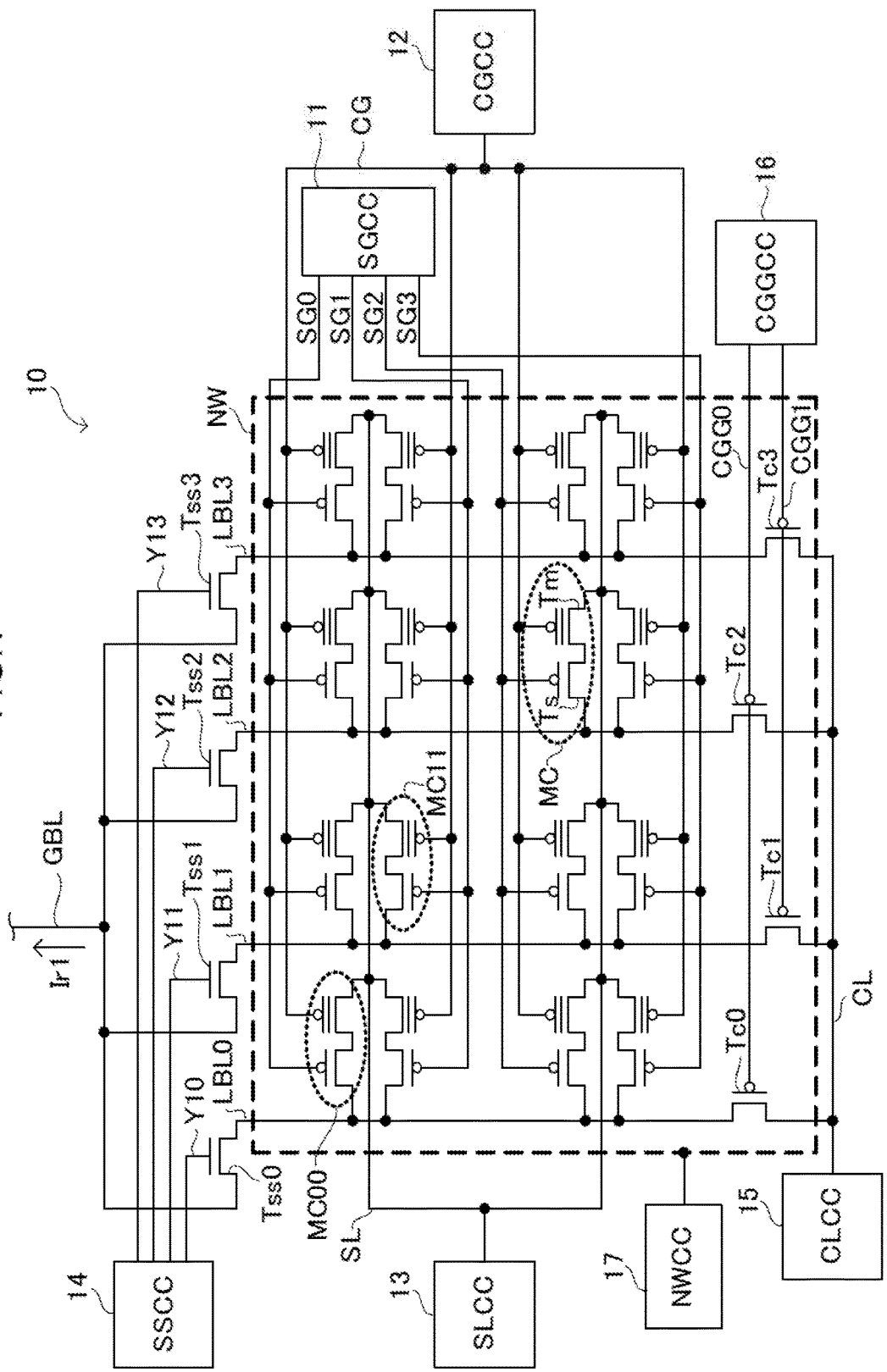
FIG. 1 is a diagram illustrating a configuration of a semiconductor storage device according to an exemplary embodiment of technology disclosed herein.

Explanation follows regarding an example of exemplary embodiment of technology disclosed herein, with reference to the drawings. In each of the drawings, the same or equivalent configuration elements and parts are appended with the same reference numerals, and duplicate explanation thereof is omitted as appropriate.

First Exemplary Embodiment

FIG. 1 illustrates a configuration of a semiconductor storage device 10 according to a first exemplary embodiment of technology disclosed herein. The semiconductor storage device 10 includes plural local bit lines LBL0, LBL1, LBL2, and LBL3, plural select gate lines SG0, SG1, SG2, and SG3 and control gate lines CG provided so as to intersect with the local bit lines.

Plural memory cells MC are laid out so as to correspond to each of the intersections between the local bit lines LBL0 to LBL3, and the select gate lines SG0 to SG3. Namely, the semiconductor storage device 10 configures what is referred to as a NOR non-volatile semiconductor memory, with plural memory cells MC laid out in a matrix pattern. Each of the memory cells MC is configured to include a select transistor Ts and a memory transistor Tm having a floating gate structure that are connected together in series. In the present exemplary embodiment, the memory transistors Tm and the select transistors Ts are each configured by a p-channel metal oxide semiconductor field effect transistor (MOSFET).

The gates of the respective plural select transistors Ts are connected to the select gate lines SG0 to SG3, and the drains of the respective plural select transistors Ts are connected to the local bit lines LBL0 to LBL3. Sectors are each configured by plural memory cells MC that are connected to the same local bit line. The select gate lines SG0 to SG3 are connected to a select gate control circuit 11. The select gate control circuit 11 ON/OFF controls the select transistors Ts by applying a specific potential to the select gate lines SG0 to SG3. When reading data stored in the memory cells MC, the select gate control circuit 11 selects the select transistor Ts of the memory cell MC from which data is to be read (sometimes referred to below as the read target memory cell) by applying a low level potential Vss to the select gate line connected to the read target memory cell.

The gate of each of the memory transistors Tm is connected to a common control gate line CG The control gate lines CG are connected to a control gate control circuit 12. When writing data to the memory cells MC, or reading data or erasing data from the memory cells MC, the control gate control circuit 12 applies a specific potential to the gate of each of the memory transistors Tm through the control gate lines CG The source of each of the memory transistors Tm is connected to a common source line SL. The source lines SL are connected to a source line control circuit 13. When writing data to the memory cells MC, or reading data or erasing data from the memory cells MC, the source line control circuit 13 applies a specific potential to the source of each of the memory transistors Tm through the source lines SL. When reading data stored in the memory cells MC, the source line control circuit 13 applies a high level potential Vdd (>Vss) to the source lines SL.

One end of each of the local bit lines LBL0 to LBL3 is respectively connected to sector select transistors Tss0, Tss1, Tss2, and Tss3. In the present exemplary embodiment, the sector select transistors Tss0 to Tss3 are each configured by an n-channel MOSFET. The drains of the sector select transistors Tss0 to Tss3 are each connected to a corresponding local bit line, and the sources thereof are each connected to a common global bit line GBL. The gates of the sector select transistors Tss0 to Tss3 are respectively connected to sector select lines Y10, Y11, Y12, and Y13. The sector select lines Y10 to Y13 are connected to a sector select control circuit 14. The sector select control circuit 14 ON/OFF controls the sector select transistors Tss0 to Tss3 by applying a specific potential to the sector select lines Y10 to Y13. When reading data stored in the memory cells MC, the sector select control circuit 14 causes the sector select transistor connected to the corresponding sector select line to adopt an ON state by applying the potential Vdd to the sector select line corresponding to the read target memory cell.

Charging transistors Tc0, Tc1, Tc2, and Tc3 are respectively connected to the other ends of each of the local bit lines LBL0 to LBL3. In the present exemplary embodiment, the charging transistors Tc0 to Tc3 are each configured by a p-channel MOSFET. The drains of the charging transistors Tc0 to Tc3 are connected to corresponding local bit lines, and the sources of the charging transistors Tc0 to Tc3 are connected to a common charging line CL. The charging line CL is connected to a charging line control circuit 15. When reading data stored in the memory cells MC, the charging line control circuit 15 applies the potential Vdd to the charging line CL.

The gates of the charging transistors Tc0 and Tc2 that are respectively connected to the local bit lines LBL0 and LBL2 are connected to a charging gate line CGG0. The gates of the charging transistors Tc1 and Tc3 that are respectively connected to the local bit lines LBL1 and LBL3 are connected to a charging gate line CGG1. Namely the gates of charging transistors that are connected to mutually adjacent local bit lines are each connected to a different charging gate line from each other. The charging gate lines CGG0 and CGG1 are connected to a charging gate control circuit 16. When reading data stored in the memory cells MC, the charging gate control circuit 16 ON/OFF controls the charging transistors Tc0 to Tc3 by applying either the potential Vdd or the potential Vss to the charging gate lines CGG0 and CGG1.

In the present exemplary embodiment, the select transistors Ts, the memory transistors Tm, and the charging transistors Tc0 to Tc3 are each configured by a p-channel MOSFET, and are each provided inside a common n-type well region NW surrounded by the broken line in FIG. 1. A well voltage control circuit 17 is connected to the n-type well region NW, and the well voltage control circuit 17 applies the potential Vdd to the n-type well region NW when reading data stored in the memory cell MC.

The number of memory cells MC contained in the semiconductor storage device 10 may be increased or decreased as appropriate. The number of the local bit lines, the select gate lines, the charging transistors, the sector select transistors, and the sector select lines may also be increased or decreased as appropriate according to the number of memory cells MC.

The local bit lines LBL0 to LBL3 are an example of bit lines of technology disclosed herein. The select gate lines SG0 to SG3 are examples of select gate lines of technology disclosed herein. The memory cells MC are examples of memory cells of technology disclosed herein, and the memory transistors Tm are examples of memory transistors of technology disclosed herein. The source lines SL are examples of source lines of technology disclosed herein. The charging transistors Tc0 to Tc3 are examples of charging transistors of technology disclosed herein. The charging line CL is an example of a charging line of technology disclosed herein. The charging gate control circuit 16 is an example of a controller of technology disclosed herein. The charging gate lines CGG0 and CGG1 are examples of control lines of technology disclosed herein.

Figure 2:
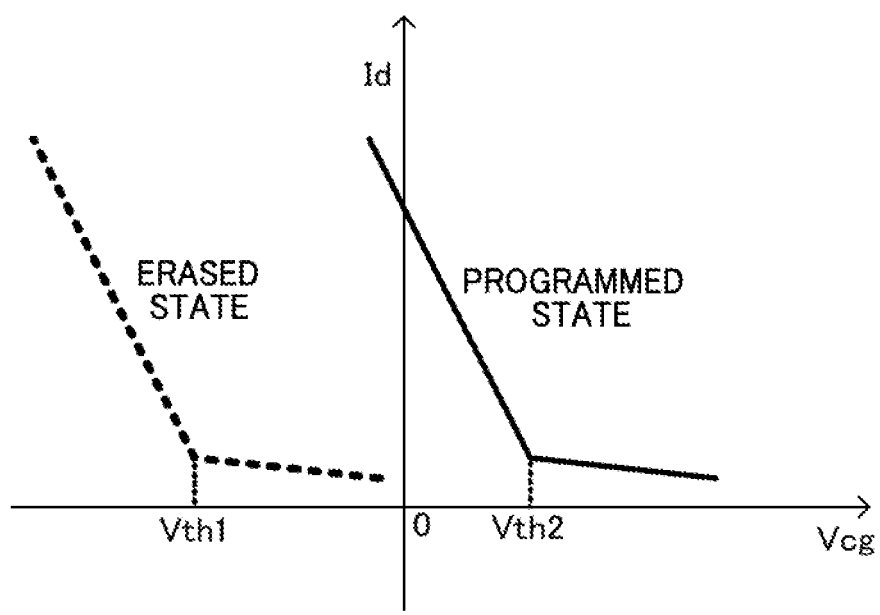
FIG. 2 is a graph illustrating an example of transmission characteristics of a memory transistor according to an exemplary embodiment of technology disclosed herein.

Explanation follows regarding operation to read data stored in the memory cells MC of the semiconductor storage device 10. FIG. 2 is a graph illustrating an example of transmission characteristics of a memory transistor Tm, with a voltage Vcg applied to the control gate line CG (the gate of the memory transistor Tm) illustrated on the horizontal axis, and the absolute value of a drain current Id of the memory transistor Tm illustrated on the vertical axis. In FIG. 2, the curve illustrated by a solid line is the transmission characteristics of a programmed state in which the floating gate of the memory transistor Tm has a comparatively large charge amount accumulated therein. In FIG. 2, the curve illustrated by a broken line is the transmission characteristics of an erased state in which the floating gate of the memory transistor Tm has a comparatively small charge amount accumulated therein. In the semiconductor storage device 10, for example, data may be stored with the programmed state corresponding to data "1", and with the erased state corresponding to the data "0".

The memory transistors Tm have a gate threshold voltage Vth1 in the erased state, and a gate threshold voltage Vth2 in the programmed state, that are different from each other. In the example in FIG. 2, the gate threshold voltage Vth1 in the erased state is negative, and the gate threshold voltage Vth2 in the programmed state is positive. When reading data stored in the memory cells MC, the potential Vdd is applied to the control gate lines CG A comparatively large current accordingly flows in the memory transistors Tm that are in the programmed state, and a comparatively small current accordingly flows in the memory transistors Tm that are in the erased state. It is accordingly possible to determine whether data "0" or "1" is stored in the memory transistor Tm by determining the magnitude of the current flowing in the memory transistor Tm.

Figure 3:
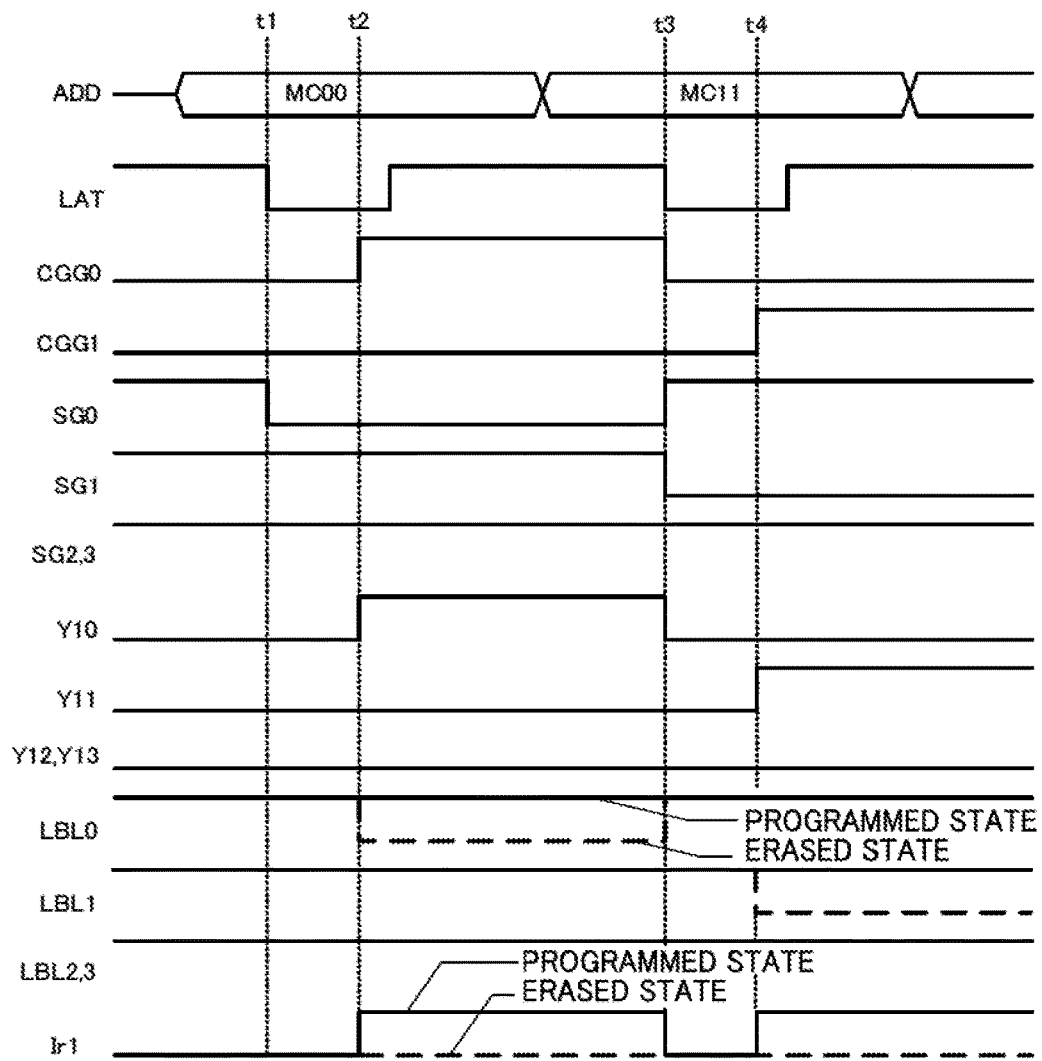
FIG. 3 is a timing chart illustrating an example of operation in a semiconductor storage device according to an exemplary embodiment of technology disclosed herein during data reading.

FIG. 3 is a timing chart illustrating an example of operation during data reading in the semiconductor storage device 10. In the example of operation illustrated here, first data is read from the memory cell MC00 illustrated in FIG. 1, and then data is read from the memory cell MC11 illustrated in FIG. 1.

When the data reading sequence is initiated, the control gate control circuit 12 applies the potential Vdd to the control gate lines CG The source line control circuit 13 applies the potential Vdd to the source lines SL. The charging line control circuit 15 applies the potential Vdd to the charging line CL. The well voltage control circuit 17 applies the potential Vdd to the n-type well region NW. The control gate lines CG the source lines SL, the charging line CL, and the n-type well region NW are fixed to specific potentials during periods of data reading from the memory cells MC, and so the potentials thereof are omitted from illustration in FIG. 3.

In a standby state prior to time t1, the charging gate control circuit 16 applies the low level potential Vss to the charging gate lines CGG0 and CGG1. The charging transistors Tc0 to Tc3 accordingly each adopt an ON state, and the potential Vdd being applied to the charging line CL is applied to all the local bit lines LBL0 to LBL3. Namely, all the local bit lines LBL0 to LBL3 are pre-charged to the potential Vdd. In the standby state, the select gate control circuit 11 applies the high level potential Vdd to all the select gate lines SG0 to SG3. The select transistors Ts of all the memory cells MC accordingly adopt an OFF state. In the standby state, the sector select control circuit 14 applies the low level potential Vss to all the sector select lines Y10 to Y13. All of the select transistors Tss0 to Tss3 accordingly adopt an OFF state.

When an address latch signal LAT transitions to low level at time t1, an address signal ADD supplied from outside the semiconductor storage device 10 is introduced to the semiconductor storage device 10. Data reading is then started from the memory cell MC00 corresponding to the read address indicated by the address signal ADD.

At time t1, the select gate control circuit 11 applies the low level potential Vss to the select gate line SG0 to which the read target memory cell MC00 is connected. Thus each of the select transistors Ts connected to the select gate line SG0 adopts an ON state. The potential of the other select gate lines SG1 to SG3 is maintained at Vdd, and so each of the select transistors Ts connected to the select gate lines SG1 to SG3 maintain an OFF state.

At time t2, the charging gate control circuit 16 applies the high level potential Vdd to the charging gate line CGG0 corresponding to the local bit line LBL0 to which the read target memory cell MC00 is connected (herein referred to as the read target local bit line). The charging transistor Tc0 thereby adopts an OFF state, and the read target local bit line LBL0 is disconnected from the charging line CL. The read target local bit line LBL0 adopts a floating state, and maintains the potential Vdd. The charging transistor Tc2 adopts an OFF state due to the high level potential Vdd being applied to the charging gate line CGG0, and the local bit line LBL2 also adopts a floating state. The charging gate control circuit 16 maintains application of the potential Vss to the charging gate line CGG1. The ON state of the charging transistors Tc1 and Tc3 is accordingly maintained, and a state is maintained in which the potential Vdd is applied to the local bit line LBL1 adjacent to the read target local bit line LBL0. Similar also applies to the local bit line LBL3.

At time t2, the sector select control circuit 14 applies the high level potential Vdd to the sector select line Y10 corresponding to the read target local bit line LBL0. The sector select transistor Tss0 accordingly adopts an ON state, and the read target local bit line LBL0 is connected to the global bit line GBL. The sector select control circuit 14 maintains application of the low level potential Vss to the other sector select lines Y11 to Y13, and maintains the OFF state of the sector select transistors Tss1 to Tss3.

Due to the sector select transistor Tss0 being in an ON state, a current Ir1 corresponding to the data stored in the read target memory cell MC00 (herein referred to as read current) flows through the read target local bit line LBL0 to the global bit line GBL. In FIG. 3, the solid line indicates the potential of the local bit line LBL0 when the memory cell MC00 is in the programmed state, and the broken line indicates the potential of the local bit line LBL0 when the memory cell MC00 is in the erased state. In FIG. 3, the solid line indicates read current Ir1 when the memory cell MC00 is in the programmed state, and the broken line indicates the read current Ir1 when the memory cell MC00 is in the erased state. The read current Ir1 is compared to a reference current by a sense amplifier (not illustrated in the drawings), and the data stored in the read target memory cell MC00 is determined.

The address latch signal LAT then transitions to high level, and the read address indicated by the address signal ADD transitions from MC00 to MC11.

At time t3, when the address latch signal LAT has transitioned to low level, the new address signal ADD is imported to the semiconductor storage device 10, and data reading is initiated from the memory cell MC11 corresponding to the read address indicated by the new address signal ADD.

At time t3, the charging gate control circuit 16 applies the low level potential Vss to the charging gate line CGG0. The charging transistors Tc0 and Tc2 accordingly adopt an ON state, and the local bit lines LBL0 and LBL2 are pre-charged to the potential Vdd. The pre-charge potential is the same as the potential Vdd being applied to the source lines SL, and so during the period in which data is being read from the previous memory cell MC00, the charge charging the local bit line LBL2 does not flow outside. Thus at time t3, there is hardly any flow of charging current in the local bit line LBL2 even though the charging transistors Tc2 adopts the ON state.

At time t3, the select gate control circuit 11 applies the high level potential Vdd to the select gate line SG0, and also applies the low level potential Vss to the select gate line SG1 to which the memory cell MC11 that is the new data read target is connected. Each of the select transistors Ts connected to the select gate line SG0 accordingly adopts an OFF state, and each of the select transistors Ts connected to the select gate line SG1 accordingly adopts the ON state. The potential of the other select gate lines SG2 and SG3 is maintained at Vdd, and each of the select transistors Ts connected thereto is maintained in an OFF state.

At time t3, the sector select control circuit 14 applies the low level potential Vss to the sector select lines Y10. The sector select transistor Tss0 accordingly adopts an OFF state, and the local bit line LBL0 is disconnected from the global bit line GBL.

At time t4, the charging gate control circuit 16 applies the high level potential Vdd to the charging gate line CGG1 corresponding to the read target local bit line LBL1. The charging transistor Tc1 accordingly adopts an OFF state, and the read target local bit line LBL1 is disconnected from the charging line CL. The read target local bit line LBL1 adopts a floating state, and the potential Vdd is maintained Note that due to the high level potential Vdd being applied to the charging gate line CGG1, the charging transistor Tc3 adopts an OFF state, and the local bit line LBL3 also adopts a floating state. The charging gate control circuit 16 maintains application of the low level potential Vss to the charging gate line CGG0. The charging transistors Tc0 and Tc2 accordingly maintain an ON state, and a state is maintained in which the potential Vdd is applied to the local bit lines LBL0 and LBL2 adjacent to the read target local bit line LBL1.

At time t4, the sector select control circuit 14 applies the high level potential Vdd to the sector select line Y11 corresponding to the read target local bit line LBL1. The sector select transistor Tss1 thereby adopts an ON state, and the read target local bit line LBL1 is connected to the global bit line GBL. The sector select control circuit 14 maintains application of the low level potential Vss to the other sector select lines Y10, Y12 and Y13, and the OFF state of the sector select transistors Tss0, Tss2, and Tss3 is maintained.

Due to the sector select transistor Tss1 being in the ON state, the read current Ir1 flows through the read target local bit line LBL1 to the global bit line GBL. In FIG. 3, the solid line indicates the potential of the local bit line LBL1 when the memory cell MC11 is in the programmed state, and the broken line indicates the potential of the local bit line LBL1 when the memory cell MC11 is in the erased state. In FIG. 3, the solid line indicates the read current Ir1 when the memory cell MC11 is in the programmed state, and the broken line indicates the read current Ir1 when the memory cell MC11 is in the erased state. The read current Ir1 is compared to a reference current by a sense amplifier (not illustrated in the drawings), and the data stored in the read target memory cell MC11 is determined.

In the above manner, in the semiconductor storage device 10 all of the charging transistors Tc0 to Tc3 are in the ON state prior to the read current Ir1 corresponding to the data stored in the memory cells flowing in the read target local bit line. All of the local bit lines LBL0 to LBL3 are thereby pre-charged to the potential Vdd. Namely, at the point in time of the start of sensing of the read current Ir1 by the sense amplifier, the potential of the read target local bit line is always Vdd. Thus due to the potential of the read target local bit line being constant at the point in time of the start of sensing of the read current Ir1, the read current Ir1 is stable, enabling the time needed by the sense amplifier to determine the data to be shortened. Namely, the semiconductor storage device 10 enables the time needed to read data to be shortened. In the semiconductor storage device 10 the charging transistors connected to the read target local bit line are also in the OFF state when the read current Ir1 flows in the read target local bit line. The read target local bit line is accordingly disconnected from the charging line, and current does not continue to flow from the charging line. This thereby enables power consumption to be suppressed when sensing the read current Ir1 compared to cases in which the charging transistors connected to the read target local bit line are maintained in an ON state.

The semiconductor storage device 10 maintains the source lines SL and the charging line CL at the same potential during the period data stored on the memory cell MC is being read. The local bit lines LBL0 to LBL3 are in a state in which the potential Vdd is applied to the charging line CL or a state disconnected from the charging line CL according to whether the corresponding charging transistor Tc0 to Tc3 is ON or OFF. Thus charge accumulated by pre-charging is not discharged from the local bit lines other than the read target local bit line, enabling the power consumption to be made smaller than methods in which charging and discharging is repeatedly performed in the local bit lines. Configuring the charging transistors Tc0 to Tc3, the memory transistors Tm, and the select transistors Ts with transistors of the same conductance type as each other enables the same potential to be employed for the source lines SL and the charging line CL.

In the semiconductor storage device 10, the charging transistors connected to the local bit lines adjacent to the read target local bit line (sometimes referred to below as the adjacent local bit lines) are in the ON state when the read current Ir1 flows in the read target local bit line. Namely, the potential of the adjacent local bit lines is Vdd while the read current Ir1 is flowing in the read target local bit lines. Due to fixing the potential of the adjacent local bit lines in this manner, the capacitive coupling between local bit lines is stable. As a result, this enables the read current Ir1 to be stabilized, and enables sensing of the read current Ir1 to be performed at higher speed by the sense amplifier.

In the semiconductor storage device 10, as illustrated in FIG. 3, at a timing (for example time t3) when each of the charging transistors are in an ON state, the potential Vdd is applied to the select gate line corresponding to the read target memory cell, and that read target memory cell is selected. Namely, there is an overlap between the pre-charging period of the local bit lines and the transition period of the select transistor Ts to an ON state in the read target memory cell. There needs to be a certain duration for the pre-charging period of the local bit line and transition period of the select transistor Ts to the ON state. Thus by making these periods overlap, the time needed to read data can be shortened compared to cases in which memory cell selection is performed after waiting for local bit line pre-charging to complete.

Second Exemplary Embodiment

Figure 4:
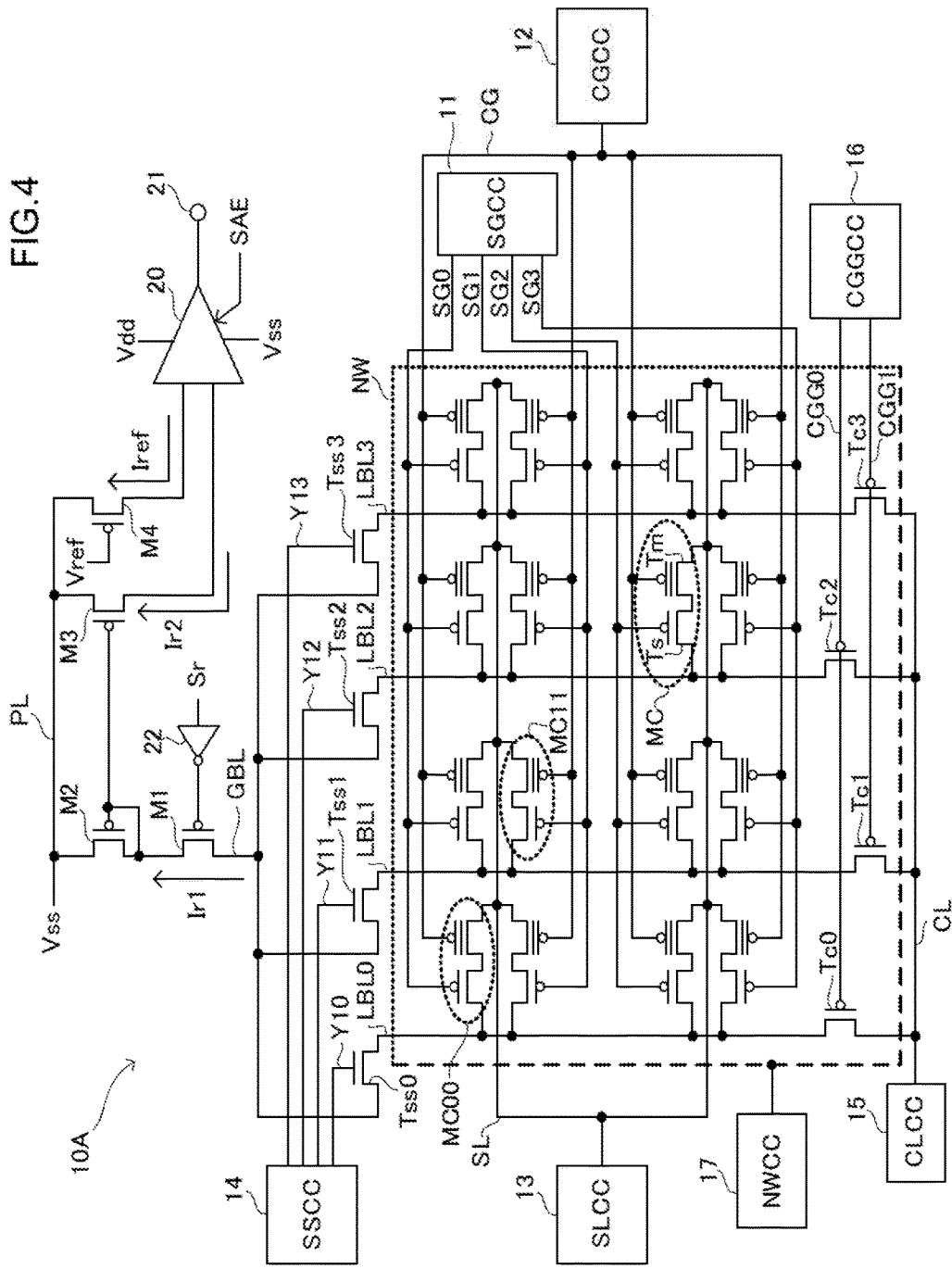
FIG. 4 is a diagram illustrating a configuration of a semiconductor storage devices according to an exemplary embodiment of technology disclosed herein.

FIG. 4 is a diagram illustrating a configuration of a semiconductor storage device 10A according to second exemplary embodiment of technology disclosed herein. The semiconductor storage device 10A according to the second exemplary embodiment further includes a circuit part that performs determination on data stored in the read target memory cell based on the read current Ir1. Namely, the semiconductor storage device 10A according to the second exemplary embodiment further includes transistors M1 to M4 and a sense amplifier 20 in addition to the configuration of the semiconductor storage device 10 according to the first exemplary embodiment. In the present exemplary embodiment the transistors M1 to M4 are each configured by a p-channel MOSFET.

The transistors M1 and M2 are connected together in series between the global bit line GBL and a power source line PL applied with the potential Vss. The source of the transistor M1 is connected to the global bit line GBL, and the drain of the transistor M1 is connected to the source of the transistor M2. A read control signal Sr is input to the gate of the transistor M1 through invertor 22. The transistor M1 is ON/OFF controlled by the read control signal Sr.

The drain of the transistor M2 is connected to the power source line PL, and the gate of the transistor M2 is connected to the source of the transistor M2. The drain of the transistor M3 is connected to the power source line PL, the gate of the transistor M3 is connected to the gate of the transistor M2, and the source of the transistor M3 is connected to one input terminal of the sense amplifier. The transistor M3, together with the transistor M2, configures a current mirror circuit, and a current Ir2, having a size corresponding to the size of the read current Ir1 flowing in the global bit line GBL, flows to one input terminal of the sense amplifier 20.

The drain of the transistor M4 is connected to the power source line PL, and the source of the transistor M4 is connected to another of the input terminals of the sense amplifier 20. A reference voltage Vref is applied to the gate of the transistor M4, and the transistor M4 flows a reference current Iref, of size corresponding to the size of the reference voltage Vref to the other input terminal of the sense amplifier 20.

The sense amplifier 20 is activated according to an externally supplied enable signal SAE. The activated sense amplifier 20 outputs from an output terminal 21 an output voltage indicating the result of comparison of the size of the current Ir2 flowing to the one input terminal, and the size of the reference current Iref flowing to the other input terminal. For example, the sense amplifier 20 outputs a high level output voltage in cases in which the size of the current Ir2 is greater than the size of the reference current Iref and outputs a low level output voltage in cases in which the size of the current Ir2 is smaller than the size of the reference current Iref. Namely, the sense amplifier 20 output a determination result of the data stored in the read target memory cell by determining the magnitude of the current Ir2 with respect to the reference current Iref. The sense amplifier 20 is an example of an output section of the technology disclosed herein.

Figure 5:
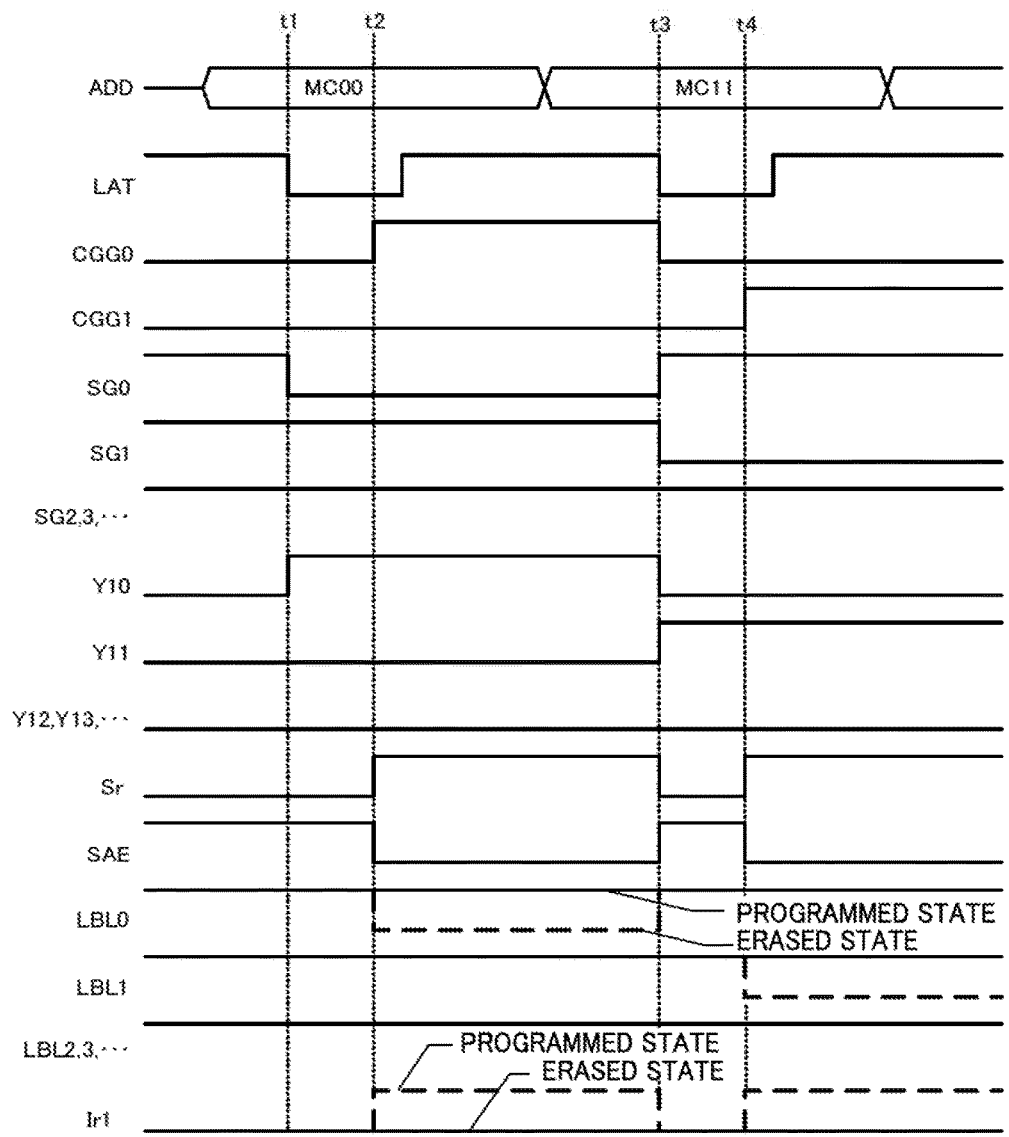
FIG. 5 is a timing chart illustrating an example of operation in a semiconductor storage device according to an exemplary embodiment of technology disclosed herein during data reading.

FIG. 5 is a timing chart illustrating an example of operation in the semiconductor storage device 10A during data reading. In the example illustrated here, first data is read from the memory cell MC00 illustrated in FIG. 4, then data is read from the memory cell MC11 illustrated in FIG. 4.

At time t1, when an address latch signal LAT has transitioned to low level, an address signal ADD is introduced into the semiconductor storage device 10A. Then data reading is initiated from the memory cell MC00 corresponding to the read address indicated by the address signal ADD.

At time t1, the select gate control circuit 11 applies the low level potential Vss to the select gate line SG0 to which the read target memory cell MC00 is connected. Each of the select transistors Ts connected to the select gate line SG0 accordingly adopts an ON state. The other select gate lines SG1 to SG3 are maintained at Vdd, and each of the select transistors Ts connected to the select gate lines SG1 to SG3 maintains an OFF state.

Moreover, at time t1, the sector select control circuit 14 applies the high level potential Vdd to the sector select line Y10 corresponding to the read target local bit line LBL0. The sector select transistor Tss0 accordingly adopts an ON state, and the read target local bit line LBL0 is connected to the global bit line GBL. Thus in the semiconductor storage device 10A according to the second exemplary embodiment, the sector select transistor is in an ON state at the same timing as the select transistor Ts is in an ON state. Thus in the semiconductor storage device 10A, the transistor M1 performs the role of opening or closing the current path through which the read current Ir1 flows. The sector select control circuit 14 maintains application of the low level potential Vss to the other sector select lines Y11 to Y13, and the select transistors Tss1 to Tss3 are maintained in an OFF state.

At time t2, the charging gate control circuit 16 applies the high level potential Vdd to the charging gate line CGG0 corresponding to the local bit line LBL0. The charging transistor Tc0 adopts an OFF state, and the read target local bit line LBL0 is disconnected from the charging line CL. The read target local bit line LBL0 adopts a floating state, and the potential Vdd is maintained. Note that due to the high level potential Vdd being applied to the charging gate line CGG0, the charging transistor Tc2 adopts an OFF state, and the local bit line LBL2 also adopts a floating state. The charging gate control circuit 16 maintains application of the potential Vss to the charging gate line CGG1. The ON state of the charging transistors Tc1 and Tc3 is accordingly maintained, and a state is maintained in which the potential Vdd is applied to the local bit line LBL1 adjacent to the read target local bit line LBL0. Similar applies to the local bit line LBL3.

At time t2, the high level read control signal Sr is input to the invertor 22. The invertor 22 supplies a signal inverted from the high level read control signal Sr to the gate of the transistor M1. The transistor M1 accordingly adopts an ON state.

Due to the sector select transistor Tss0 and the transistor M1 both being in an ON state, the read current Ir1 corresponding to the data stored in the memory cell MC00 flows through the read target local bit line LBL0 to the global bit line GBL. In FIG. 5 the solid line indicates the potential of the local bit line LBL0 when the memory cell MC00 is in the programmed state, and the broken line indicates the potential of the local bit line LBL0 when the memory cell MC00 is in the erased state. In FIG. 5, the solid line indicates read current Ir1 when the memory cell MC00 is in the programmed state, and the broken line indicates the read current Ir1 when the memory cell MC00 is in the erased state.

At time t2, the sense amplifier 20 is activated when the enable signal SAE transitions to low level. The current Ir2 of size corresponding to the size of the read current Ir1 is compared to the reference current Iref by the sense amplifier 20, and the data stored in the read target memory cell MC00 is determined.

Then after this the address latch signal LAT transitions to high level, and the read address indicated by the address signal ADD transitions from MC00 to MC11.

At time t3, when the address latch signal LAT transitions to low level, the address signal ADD is imported into the semiconductor storage device 10A, and the data reading is initiated from the memory cell MC11 corresponding to the read address indicated by the new address signal ADD.

At time t3, the charging gate control circuit 16 applies the low level potential Vss to the charging gate line CGG0. The charging transistors Tc0 and Tc2 accordingly maintain the ON state, and the local bit lines LBL0 and LBL2 are pre-charged at the potential Vdd. Due to this pre-charge potential being the same as the potential Vdd applied to the source lines SL, charge that has charged the local bit line LBL2 during the period in which data was read from the previous memory cell MC00 does not flow outside. Thus even when the charging transistors Tc2 adopts an ON state at time t3, substantially no charge current flows in the local bit line LBL2.

At time t3, the select gate control circuit 11 applies the high level potential Vdd to the select gate line SG0, and also applies the low level potential Vss to the select gate line SG1 to which the memory cell MC11 that is the new data read target is connected. Each of the select transistors Ts connected to the select gate line SG0 accordingly adopt the OFF state, and each of the select transistors Ts connected to the select gate line SG1 accordingly adopt the ON state. The potential of the other select gate lines SG2 and SG3 is maintained at Vdd, and each of the select transistors Ts connected thereto is maintained in an OFF state.

Moreover, at time t3, the sector select control circuit 14 applies the low level potential Vss to the sector select line Y10, and also applies the high level potential Vdd to the sector select line Y11 corresponding to the local bit line LBL1. The sector select transistor Tss0 thereby adopts an OFF state, and the local bit line LBL0 is disconnected from the global bit line GBL. When the sector select transistor Tss1 adopts an ON state, the read target local bit line LBL1 is connected to the global bit line GBL. The sector select control circuit 14 maintains application of the low level potential Vss to the other sector select lines Y12 and Y13, and the select transistors Tss2 and Tss3 are maintained in an OFF state.

At time t3, the transistor M1 adopts an OFF state due to the read control signal Sr transitioning to low level, and the sense amplifier 20 adopts a non-active state due to the enable signal SAE transitioning to high level.

At time t4, the charging gate control circuit 16 applies the high level potential Vdd to the charging gate line CGG1 corresponding to the read target local bit line LBL1. The charging transistor Tc1 accordingly adopts an OFF state, and the read target local bit line LBL1 is disconnected from the charging line CL. The read target local bit line LBL1 adopts a floating state, and the potential Vdd is maintained. Note that due to the high level potential Vdd being applied to the charging gate line CGG1, the charging transistor Tc3 adopts an OFF state, and the local bit line LBL3 also adopts a floating state. The charging gate control circuit 16 maintains application of the low level potential Vss to the charging gate line CGG0. The charging transistors Tc0 and Tc2 accordingly maintain the ON state, and a state is maintained in which the potential Vdd is applied to the local bit lines LBL0 and LBL2 adjacent to the read target local bit line LBL1.

At time t4, a high level read control signal Sr is input to the invertor 22. The invertor 22 supplies a signal inverted from the high level read control signal Sr to the gate of the transistor M1. The transistor M1 accordingly adopts an ON state.

Due to the sector select transistor Tss1 and the transistor M1 both being in an ON state, the read current Ir1 corresponding to the data stored in the memory cell MCI flows through the read target local bit line LBL1 to the global bit line GBL. In FIG. 5 the solid line indicates the potential of the local bit line LBL1 when the memory cell MC11 is in the programmed state, and the broken line indicates the potential of the local bit line LBL1 when the memory cell MC11 is in the erased state. In FIG. 5, the solid line indicates read current Ir1 when the memory cell MC11 is in the programmed state, and the broken line indicates the read current Ir1 when the memory cell MC11 is in the erased state.

At time t4, the sense amplifier 20 is activated when the enable signal SAE transitions to low level. The current Ir2 of size corresponding to the size of the read current Ir1 is compared to the reference current Iref by the sense amplifier 20, and the data stored in the read target memory cell MC11 is determined.

The semiconductor storage device 10A according to the second exemplary embodiment of technology disclosed herein, similarly to the semiconductor storage device 10 according to the first exemplary embodiment, enables the time and the power needed to read data stored in memory cells to be reduced.

The sense amplifier 20 is also intermittently activated according to the enable signal SAE, thereby enabling power consumption to be suppressed in comparison to cases in which the sense amplifier 20 is always activated.

In the semiconductor storage device 10A, the select transistors Ts, the memory transistors Tm, and the charging transistors Tc0 to Tc3 are each configured by a p-channel MOSFET. The memory cell MC is disposed on the high potential side (the Vdd side), and the sense amplifier 20 is disposed on the low potential side (the Vss side). The read current Iref read from the memory cells MC accordingly flows through the local bit lines and the global bit line GBL toward the power source line PL applied with the potential Vss (<Vdd).

Suppose that the memory cells MC were disposed on the low potential side with respect to the sense amplifier 20, then each of the above transistors would be configured by an n-channel transistor. In such a configuration, there would be a need to charge up from Vss level when pre-charging each of the local bit lines, and so the time needed for pre-charging would be comparatively long. Moreover, when reading data from the next memory cell MC, there would be a need to discharge the previous read target local bit line, and to charge up the next read target local bit line, resulting in comparatively large power consumption.

However, in cases in which each of the above transistors is configured by a p-channel transistor, and the memory cells MC are disposed on the high potential side with respect to the sense amplifier 20, then the charging line and the source lines are at the same potential (Vdd), thereby enabling pre-charging to be performed for each of the local bit lines in parallel when the select gate line is started up. Thus sensing of the read current Ir1 can be performed immediately after the transistor M1 has adopted an ON state. This thereby enables the time to read data to be shortened in comparison to cases in which the memory cells MC are disposed on the low potential side with respect to the sense amplifier 20. When reading data from the next memory cell MC, it is sufficient to pre-charge the previous read target local bit line. Moreover, in such cases it is also sufficient to perform charging up from the potential of that respective local bit line, and there is not always a need to charge up from the Vss level. This thereby enables the power consumption to be made small compared to cases in which the memory cell MC is disposed on the low potential side with respect to the sense amplifier 20.

An aspect of the technology disclosed herein exhibits the advantageous effect of enabling the time and power needed to read data stored in memory cells to be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor storage device, comprising:
    a plurality of bit lines;
    a plurality of select gate lines that intersect with the plurality of bit lines;
    a plurality of memory cells that each include a p-channel memory transistor, with the plurality of memory cells each disposed so as to correspond to respective portions of intersection between the plurality of bit lines and the plurality of select gate lines;
    a source line that is connected to each of the memory transistors, and that is applied with a first specific potential when reading data stored in the memory cells;
    a plurality of p-channel charging transistors that are respectively connected to the plurality of bit lines;
    a charging line that is connected to each of the plurality of charging transistors, and that is applied with a second specific potential when reading data stored in the memory cells; and
    a controller that places each of the charging transistors in an ON state prior to current, corresponding to data stored in a read target memory cell of the plurality of memory cells on which data reading is to be performed, flowing in a read target bit line that is one of the plurality of bit lines and that corresponds to the read target memory cell, the controller placing a charging transistor connected to the read target bit line in an OFF state when a current corresponding to data stored in the read target memory cell flows in the read target bit line.

2. The semiconductor storage device of claim 1, wherein the source line and the charging line are maintained at the same potential during a period of reading data stored in the memory cells.

3. The semiconductor storage device of claim 1, wherein, during a period of reading data stored in the memory cells, each of the plurality of bit lines is in a state of being applied with a potential of the charging line, or in a state disconnected from the charging line, according to ON/OFF switching of the charging transistor.

4. The semiconductor storage device of claim 1, wherein the controller places charging transistors, among the plurality of p-channel charging transistors, that are connected to bit lines adjacent to the read target bit line, in an ON state when current corresponding to data stored in the read target memory cell flows in the read target bit line.

5. The semiconductor storage device of claim 1, wherein respective gates of the charging transistors connected to mutually adjacent bit lines among the plurality of bit lines, are each connected to the controller through mutually different control lines.

6. The semiconductor storage device of claim 1, wherein a third specific potential is applied to a select gate line, that is one of the plurality of select gate lines and that corresponds to the read target memory cell, at a timing when each of the charging transistors is in an ON state, and the read target memory cell is selected.

7. The semiconductor storage device of claim 1, wherein each of the plurality of bit lines is at the same potential at a timing when the read target memory cell is selected.

8. The semiconductor storage device of claim 1, further comprising an output section that is connected to each of the plurality of bit lines, and that outputs an output voltage corresponding to a size of the current corresponding to data stored in the read target memory cell.

9. The semiconductor storage device of claim 8, wherein the current corresponding to data stored in the read target memory cell flows toward a lower potential line having a lower potential than the potential of the charging line and the source line.

10. The semiconductor storage device of claim 8, wherein the output section outputs, as the output voltage, a result of a comparison of the size of the current corresponding to data stored in the read target memory cell with a size of a reference current.

11. The semiconductor storage device of claim 1, further comprising a global bit line connected to each of the plurality of bit lines.

12. The semiconductor storage device of claim 11, further comprising a plurality of sector select transistors provided between each of the plurality of bit lines and the global bit line.

13. The semiconductor storage device of claim 1, wherein each of the plurality of memory cells includes a select transistor connected to a corresponding bit line and a corresponding select gate line, and includes the memory transistor connected to the select transistor.

14. The semiconductor storage device of claim 1, wherein the memory transistor has a floating gate structure.

15. A method of reading data stored in a memory cell of a semiconductor storage device that includes a plurality of bit lines, a plurality of select gate lines that intersect with the plurality of bit lines, a plurality of memory cells that each include a p-channel memory transistor, with the plurality of memory cells each disposed so as to correspond to respective portions of intersection between the plurality of bit lines and the plurality of select gate lines, and a source line that is connected to each of the memory transistors, the reading method comprising:
    connecting each of the bit lines to a charging line having a specific potential prior to current, corresponding to data stored in a read target memory cell of the plurality of memory cells on which data reading is to be performed, flowing in a read target bit line that is one of the plurality of bit lines and that corresponds to the read target memory cell;
    disconnecting the read target bit line from the charging line when the current corresponding to data stored in the read target memory cell flows in the read target bit line; and
    having the current corresponding to data stored in the read target memory cell flow toward a lower potential line having a lower potential than the potential of the charging line and the source line.

16. The reading method of claim 15, wherein a potential at the same potential as the source lines is applied to each of the bit lines prior to the current corresponding to data stored in the read target memory cell flowing in the read target bit line.

17. The reading method of claim 16, wherein the specific potential is applied to bit lines adjacent to the read target bit line when the current corresponding to data stored in the read target memory cell flows in the read target bit line.

18. The reading method of claim 15, wherein, at a timing when the specific potential is applied to each of the bit lines, a specific potential is applied to a select gate line, among the plurality of select gate lines, that corresponds to the read target memory cell, and the read target memory cell is selected.

19. The reading method of claim 15, wherein each of the plurality of bit lines is at the same potential as each other at the timing when the read target memory cell is selected.

* * * * *